US006747775B2

(12) United States Patent
Little

(10) Patent No.: US 6,747,775 B2
(45) Date of Patent: Jun. 8, 2004

(54) DETUNABLE FABRY-PEROT INTERFEROMETER AND AN ADD/DROP MULTIPLEXER USING THE SAME

(75) Inventor: Michael J. Little, Oak Park, CA (US)

(73) Assignee: NP Photonics, Inc., Tucson, AZ (US)

( * ) Notice: Subject to any disclaimer, the term of this patent is extended or adjusted under 35 U.S.C. 154(b) by 0 days.

(21) Appl. No.: 10/331,617

(22) Filed: Dec. 31, 2002

(65) Prior Publication Data

US 2003/0123125 A1 Jul. 3, 2003

Related U.S. Application Data

(63) Continuation-in-part of application No. PCT/US02/12496, filed on Apr. 22, 2002, which is a continuation-in-part of application No. 10/085,143, filed on Mar. 1, 2002, now Pat. No. 6,665,109, and a continuation-in-part of application No. 09/811,612, filed on Mar. 20, 2002, now Pat. No. 6,519,074, which is a continuation-in-part of application No. 09/766,687, filed on Jan. 19, 2001, now Pat. No. 6,597,461.

(60) Provisional application No. 60/303,772, filed on Jul. 10, 2001, provisional application No. 60/284,943, filed on Apr. 20, 2001, provisional application No. 60/211,529, filed on Jun. 15, 2000, and provisional application No. 60/190,110, filed on Mar. 20, 2000.

(51) Int. Cl.[7] .................. G02B 26/00; G02B 27/00; G02B 9/02; G02F 1/03; H01S 3/10

(52) U.S. Cl. .................. 359/238; 359/291; 359/295; 359/298; 359/260; 359/578; 359/359; 356/519; 356/454; 356/450; 356/506; 372/20; 372/50; 398/43

(58) Field of Search .................. 359/290, 291, 359/295, 298, 238, 260, 359, 578, 224, 230, 506, 336, 4.01; 356/450, 454, 519; 372/20, 26, 32, 50, 96, 99; 398/43

(56) References Cited

U.S. PATENT DOCUMENTS

| 3,802,775 A | * 4/1974 | Hughes ..................... 356/4.01 |
| 4,203,128 A | 5/1980 | Guckel et al. .............. 331/156 |
| 4,400,058 A | 8/1983 | Durand et al. .............. 359/359 |

(List continued on next page.)

FOREIGN PATENT DOCUMENTS

| EP | 702 205 A2 | 8/1995 |
| WO | WO 99/34484 | 7/1999 |

OTHER PUBLICATIONS

Joost C. Lotters et al.; "Polydimethylisiloxane as an elastic material applied in a capacitive accelerometer"; (1996); J. Micromech. Microeng. 6 (1996) pp. 52–54.

P. Bley; "Polymers–an Excellent and Increasingly Used Material for Microsystems"; Sep. 1999; SPIE vol. 3876; pp. 172–184.

(List continued on next page.)

Primary Examiner—Loha Ben
(74) Attorney, Agent, or Firm—Fleshner & Kim LLP

(57) ABSTRACT

A detunable Fabry-Perot interferometer, and method of tuning a Fabry-Perot interferometer are provided. The Fabry-Perot interferometer includes a first mirror, a second mirror oriented with respect to the first mirror so as to define a Fabry-Perot cavity therebetween, and an actuator configured to adjust a resonant wavelength of the Fabry-Perot cavity by varying a gap between the first and second mirrors, wherein the actuator is configured to selectively maintain the first and second mirrors in a substantially non-parallel relationship while the resonant wavelength of the Fabry-Perot interferometer is varied. The detunable Fabry-Perot interferometer can be employed in a multiplexer of a telecommunications system, as provided.

26 Claims, 8 Drawing Sheets

U.S. PATENT DOCUMENTS

| | | | | |
|---|---|---|---|---|
| 4,466,699 | A | * | 8/1984 | Droessler et al. ............ 359/578 |
| 4,553,816 | A | | 11/1985 | Durand et al. .............. 359/359 |
| 4,566,935 | A | | 1/1986 | Hornbeck .................... 438/29 |
| 4,825,262 | A | | 4/1989 | Mallinson ................... 356/454 |
| 4,859,060 | A | | 8/1989 | Katagiri et al. ............. 356/454 |
| 5,068,861 | A | | 11/1991 | Abbott et al. ................. 372/20 |
| 5,313,333 | A | | 5/1994 | O'Brien et al. ............. 359/820 |
| 5,381,232 | A | | 1/1995 | Van Wijk ................... 356/519 |
| 5,383,168 | A | | 1/1995 | O'Brien et al. .......... 369/44.14 |
| 5,461,507 | A | | 10/1995 | Westland et al. ........... 359/289 |
| 5,510,914 | A | | 4/1996 | Liu et al. .................... 349/136 |
| 5,555,089 | A | * | 9/1996 | Dunn et al. ................. 356/506 |
| 5,561,523 | A | | 10/1996 | Blomberg et al. .......... 356/454 |
| 5,621,523 | A | * | 4/1997 | Oobayashi et al. ......... 356/336 |
| 5,822,110 | A | | 10/1998 | Dabbaj ....................... 359/293 |
| 5,917,647 | A | | 6/1999 | Yoon .......................... 359/298 |
| 5,920,391 | A | * | 7/1999 | Grasdepot et al. .......... 356/519 |
| 5,970,190 | A | | 10/1999 | Fu et al. ....................... 385/37 |
| 6,075,598 | A | * | 6/2000 | Kauppinen .................. 356/450 |
| 6,078,395 | A | | 6/2000 | Jourdain et al. ............ 356/519 |
| 6,137,819 | A | | 10/2000 | Najda .......................... 372/96 |
| 6,169,604 | B1 | * | 1/2001 | Cao ............................ 356/519 |
| 6,324,192 | B1 | | 11/2001 | Tayebati ...................... 372/20 |
| 6,335,817 | B1 | | 1/2002 | Phillipps .................... 359/290 |
| 6,400,738 | B1 | | 6/2002 | Tucker et al. ................. 372/20 |
| 6,538,748 | B1 | * | 3/2003 | Tucker et al. ............... 356/519 |

OTHER PUBLICATIONS

Thorbjorn Ebeforst et al.; "New small radius joints based on thermal shrinkage of polyimide in V–grooves for robust self–assembly 3D microstructures"; J. Micromech. Microeng. 8 (1998); pp. 188–194.

M Pedersent et al.; "A capacitive differential pressure sensor with polyimide diaphragm"; J. Micromech. Microeng. 7 (1997); pp. 250–252.

Frank Niklaus et al.; "Low–temperature full wafer adhesive bonding"; J. Micromech. Microeng. 11 (2001); pp. 100–107.

Kenji Suzuki et al.; "Insect–Model Based Microrobot with Elastic Hinges"; Journal of Microelectromechanical Systems, vol. 3, No. 1, Mar. 1994; pp. 4–9.

K. Minami et al.; "Fabrication of Distributed Electrostatic Micro Actuator (DEMA)"; Journal of Microelectromechanical Systems, vol. 2, No. 3, Sep. 1993; pp. 121–127.

Cheol–Hyun Han et al.; "Parylene–Diaphragm Piezoelectric Acoustic Transducers"; The Thirteenth Annual International Conference on Microelectromechanical Systems; (2000), pp. 148–152.

Krzysztof A R B Pietraszewski et al.; "Cryogenic servo–stabilised Fabry–Perot Interferometer for imaging at 2–2.5microns"; SPIE Proceedings, vol. 2814 (1996): pp. 139–146.

T R Hicks et al.; "The application of capacitance micrometry to the control of Fabry–Perot etalons"; J. Phys. E. Instrum., vol. 17, 1984, pp. 49–55.

P. Tayebati et al.; "Widely Tunable Fabry–Perot filter Using Ga(Al)As–AlO$_x$ Deformable Mirrors"; IEEE Photonics Technology Letters, vol. 10, No. 3, Mar. 1998; pp. 394–396.

P. Tayebati et al.; "Microelectromechanical tunable filters with 0.47nm linewidth and 70nm tuning range"; Electronics Letters; Jan. 8, 1998; vol. 34, No. 1; pp. 76–78.

M.C. Larson et al.; "Vertical Coupled–Cavity Microinterferometer on GaAs with Deformable–Membrane Top Mirror"; IEEE Photonics Technology Letters, vol. 7, No. 4, Apr. 1995; pp. 382–384.

K. Aratani et al.; "Process and Design Considerations for Surface Micromachined Beams for a Tunable Interferometer Array in Silicon"; Proc. IEEE Micro Electro Mechanical Systems, Ft. Lauderdal, FL, 1993, pp. 230–235.

MEM–TUNE Tunable Filter; Preliminary Data Sheet; May 2000.

OPM–1 Optical Performance Monitor; Preliminary Data Sheet; May 2000.

GTM–1 EDFA Gain–Tilt Monitor; Preliminary Data Sheet; May 2000.

J.H. Jerman et al.; "Miniature Fabry–Perot Interferometers Micromachined in Silicon for use in Optical Fiber WDM Systems"; Transducers '91, International Solid–State Conference on Sensors and Actuators, pp. 372–375 (1991) IEEE, pp. 472–475.

P. Tayebati; "Microelectromechanical tunable filter with stable haft symmetric cavity"; Electronics Letters–IEEE, 1998, p. 1967.

E. Ollier et al.; "Micro–Opto–Electro–Mechanical Systems: Recent developments and LeETI's acitivities"; SPIE; vol. 4075; pp. 12–21.

T. R. Hicks et al.; "The application of capacitance micrometry to the control of Fabry–Perot etalons"; J. Phys. E: Sci. Instrum., vol. 17, 1984; pp. 49–55.

* cited by examiner

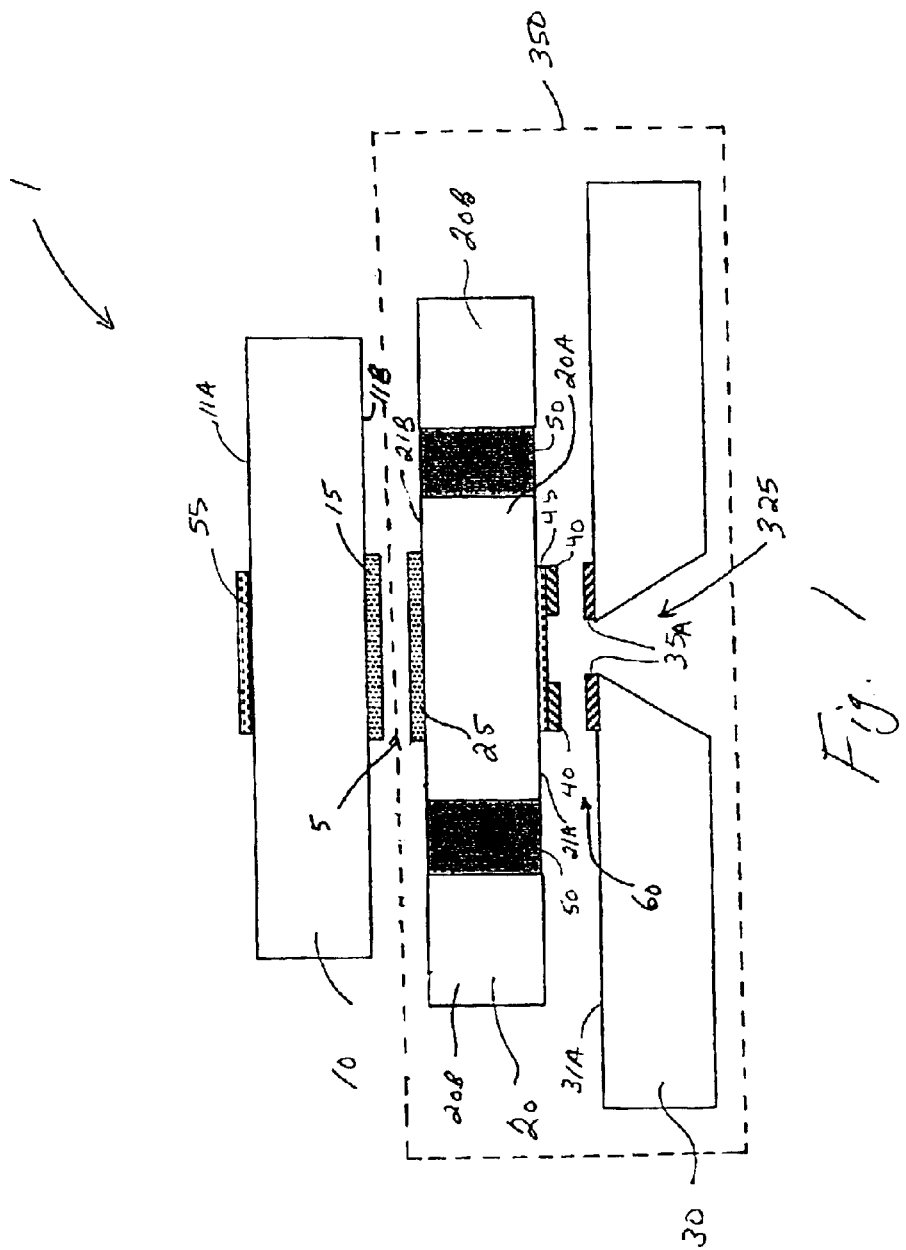

DETUNABLE FABRY-PEROT INTERFEROMETER AND AN ADD/DROP MULTIPLEXER USING THE SAME

This is a Continuation-in-part (CIP) of International (PCT) Application No: PCT/US02/12496, filed Apr. 22, 2002, which is a CIP of U.S. patent application Ser. No. 10/085143, filed Mar. 1, 2002 now U.S. Pat. No. 6,665,109, which claims priority to U.S. Provisional Application Nos. 60/284,943, filed Apr. 20, 2001 and 60/303,772, filed Jul. 10, 2001 and is also a CIP of U.S. patent application Ser. No. 09/811,612, filed Mar. 20, 2001 now U.S. Pat. No. 6,519,074, which is a CIP of U.S. patent application Ser. No. 09/766,687, filed Jan. 19, 2001 now U.S. Pat. No. 6,597,461, which claims priority to U.S. Provisional Application Nos. 60/190,110, filed Mar. 20, 2000 and 60/211,529, filed Jun. 15, 2000. Incorporation By Reference. The entire disclosure of the prior application is considered as being part of the disclosure of the accompanying application and is hereby incorporated by reference therein.

BACKGROUND OF THE INVENTION

1. Field of the Invention

The invention relates to a detunable Fabry-Perot Interferometer, and a method of tuning a Fabry-Perot Interferometer. Further, the invention relates to a detunable Fabry-Perot Interferometer employed in a multiplexer of a telecommunications system.

2. Background of the Related Art

There is a continuing need for tunable optical components for various applications, such as optical networking, wavelength-division-multiplexing and other telecommunications applications.

Existing technologies for tunable optical components are either too costly, unreliable, or do not exbibit the performance needs for present and/or future systems requirements.

SUMMARY OF THE INVENTION

An object of the invention is to solve at least the above problems and/or disadvantages and to provide at least the advantages described hereinafter.

The invention relates to a detunable Fabry-Perot Interferometer, and a method of tuning a Fabry-Perot Interferometer. Further, the invention relates to a detunable Fabry-Perot Interferometer employed in a multiplexer of a telecommunications system.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIG. 1 is a schematic side cross-sectional view of a Fabry-Perot interferometer, according to an embodiment of the invention;

DETAILED DESCRIPTION OF PREFERRED EMBODIMENTS

Figure 1B:
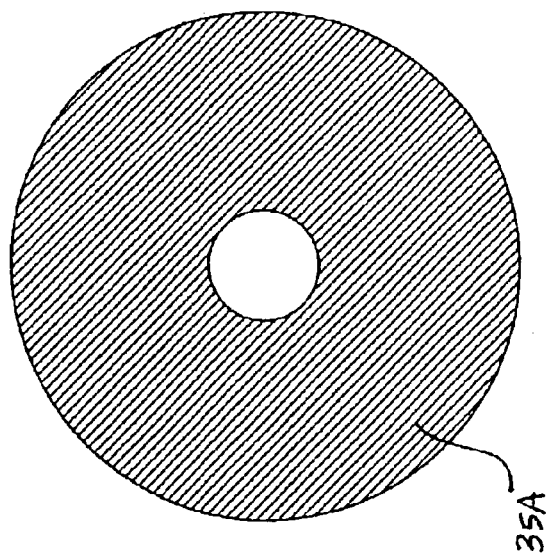
FIGS. 1A and 1B show a plan view of exemplary electrodes of an actuator according to an embodiment of the invention.

The invention provides a detunable Fabry-Perot interferometer, and a method of tuning the Fabry-Perot interferometer. Fabry-Perot interferometers, or filters, transmit light of a predetermined wavelength and reflect the non-transmitted light back to the source. Generally, Fabry-Perot interferometers consist of an optical cavity formed by two parallel reflectors or mirrors. When the optical path length between the reflectors is an integer number of half waves, the structure becomes optically resonant, with zero electric field intensity at the boundaries, and energy is coupled through the interferometer. Generally, to make the interferometer tunable, one of the reflectors is fixed and the other is configured so that it is movable, with the distance between them controlled to "tune" the wavelength that will pass through the interferometer.

An example of a Fabry-Perot cavity interferometer is shown in FIG. 1. A tunable Fabry-Perot cavity is described in co-pending International (PCT) parent application Ser. No. PCT/US02/12476, filed Apr. 22, 2002, entitled "MEMS-based Tunable Fabry-Perot Filters and Method of Forming Same". Any of the embodiments disclosed in PCT Application No. PCT/US02/12496 can be employed to realize the apparatus and methods according to the invention discussed herein.

The Fabry-Perot interferometer 1 of FIG. 1 includes a mirror support 10 and a compliant optical support 20. A Fabry-Perot cavity 5 is formed by a first mirror 15 and a second mirror 25. The first mirror 15 is attached to the mirror support 10 and, in a preferred embodiment, is fixed in place by the mirror support 10. The mirror support 10 may further include an anti-reflective (AR) coating 55. In this embodiment, the AR coating 55 is positioned on a surface 11A of the mirror support 10 opposite to a surface 11B of the mirror support 10, on which the first mirror 15 is positioned.

The second mirror 25 is attached to the compliant optical support 20. The compliant optical support 20 is formed of a frame 20B, an island 20A, and a compliant member 50, which attaches the island 20A to the frame 20B, and provides flexibility therebetween. In one preferred embodiment, the second mirror 25, which is affixed to the island 20A of the compliant optical support 20, is movable with respect to the first mirror 15, which is affixed to the first layer 10, via an actuator 60, which will be further discussed hereafter.

The mirror support 10, the frame 20B, and the island portion 20A of the compliant optical support 20 are preferably formed of a generally inflexible material, preferably a material that is compatible with micro-electro-mechanical systems fabrication processes, such as silicon. However, other materials, generally or partially flexible, may also be appropriate. The compliant member 50 is formed of a flexible material, preferably a highly compliant polymeric material, such as an elastomer. However, other materials may also be appropriate.

In operation, the actuator 60 can be controlled to apply a force to the island 20A, thereby moving the island 20A. The compliant member 50 exerts a restoring force to the island 20A, which tends to urge the island 20A back into alignment with the frame 20B when the actuating force is removed. The actuator 60 functions to move at least the island 20A, thereby varying a distance between the mirrors 15 and 25, and thus varying the wavelength to which the Fabry-Perot cavity 5 is tuned. The actuator 60 can include any number and configuration of magnetic, electrostatic, or mechanical force transducers.

In a preferred embodiment, the actuator 60 includes a first set 40 of electrodes 40A positioned on a surface 21A of the island 20A opposite to a surface 21B on which the second mirror 25 is positioned. In one preferred embodiment, an AR coating 45 is provided between the surface 21A of the island portion 20A and the electrodes 40A.

The actuator 60 further includes a common electrode 35A positioned on a surface 31A of an actuator support 30 of the Fabry-Perot interferometer 1, according to an embodiment of the invention. The actuator support 30 includes a hole 325 for passing source light to the second mirror 25. The actuator support 30 is preferably formed of a generally inflexible material, preferably a material that is compatible with micro-electro-mechanical systems fabrication processes, such as silicon. However, other materials, generally or partially flexible, may also be appropriate. The compliant optical support 20 and the actuator support 30 together form an actuated optical support 350, which is described in detail in co-pending U.S. parent patent application Ser. No. 10/085, 143, filed Mar. 1, 2002, entitled "Compliant Mechanism and Method of Forming Same", which is hereby incorporated by reference.

Figure 1A:
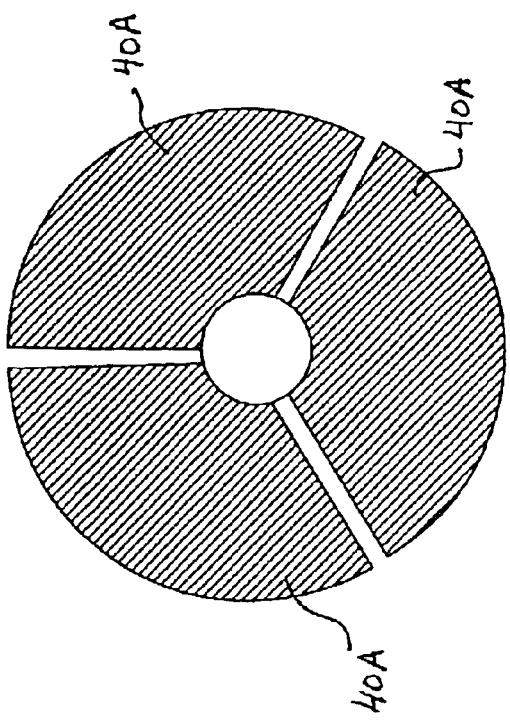
Figure 2:
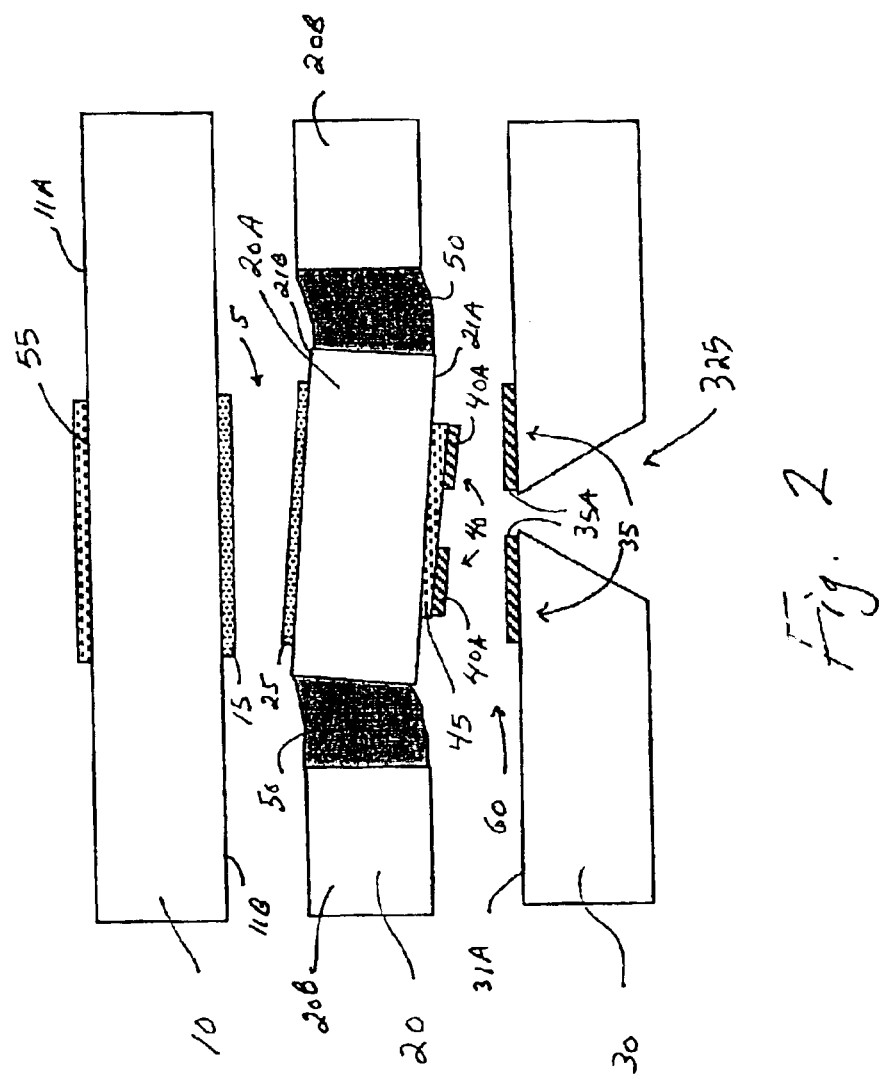
FIG. 2 is a schematic side cross-sectional view of a Fabry-Perot interferometer, according to an embodiment of the invention, showing the island of the compliant optical support in a tilted configuration.

FIGS. 1A and 1B show a plan view of the electrodes 40A and 35A. In this embodiment, three electrodes 40A are provided on the compliant optical support 20 and one common electrode 35A is provided on the actuator support 30. However, this arrangement could be reversed. Further, a variety of other configurations of electrodes which cooperatively function together could be utilized.

The electrodes 40A, 35A are configured to generate an electrostatic force when a command signal is applied thereto. The command signal can be configured to create a repulsive or an attractive electrostatic force between the electrodes.

Traditional Fabry-Perot cavities are tuned by varying the distance between parallel partially reflective mirrors. Generally, one mirror is held fixed, while the other mirror is moved with respect to the fixed mirror to "tune" the Fabry-Perot cavity to a particular wavelength.

The Fabry-Perot interferometer according to the invention includes the compliant member 50. The compliant member 50 allows the island 20A to flex with respect to the frame 20B of the compliant optical support 20. By controlling the actuator 60, the island 20A can be flexed with respect to the frame 20B to vary the distance between the first and second mirrors 15 and 25 to "tune" the Fabry-Perot cavity 5 to pass a desired wavelength of light so that the Fabry-Perot cavity 5 passes a predetermined or desired wavelength of light while reflecting substantially all other wavelengths of light. More importantly, by varying the voltage applied between the individual electrodes 35A, 40A, of the respective sets 35, 40 of electrodes, the island 20A, and thus the second mirror 25, can be tilted with respect to the first mirror 15 to "de-tune" the Fabry-Perot cavity 5. That is, while the second mirror 25 is tilted with respect to the first mirror 15, the Fabry-Perot cavity 5 reflects substantially all wavelengths of light independent of the spacing between mirrors 15 and 25.

FIGS. 3A–3D schematically show the steps of detuning, and then retuning a Fabry-Perot cavity according to a method of the invention. It is noted that in FIGS. 3A–3D only the first and second mirrors 15, 25 and the cavity 5 are shown for simplicity of explanation.

Figure 3:
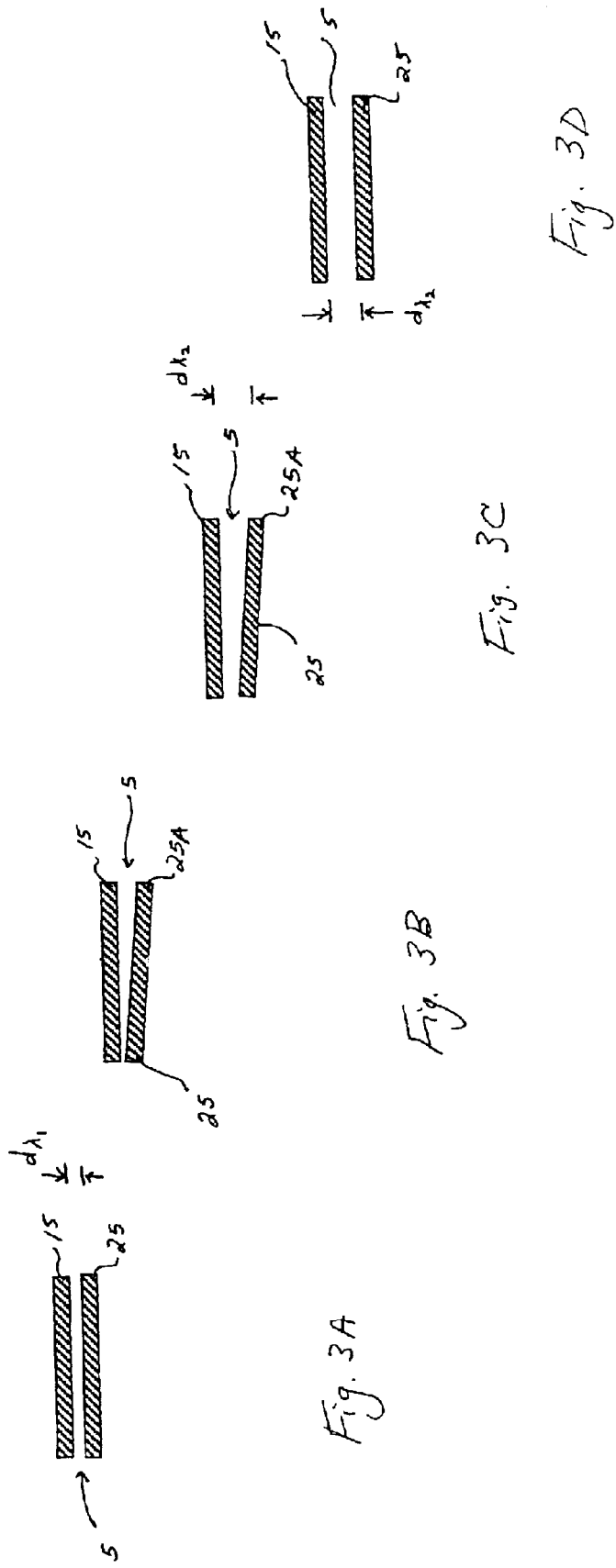
FIGS. 3A–3D schematically shows the steps of de-tuning, scanning and then re-tuning a Fabry-Perot cavity, according to a method of the invention.

As shown in FIG. 3A, the Fabry-Perot cavity 5 is initially tuned to a desired wavelength $\lambda 1$ by orienting the first and second mirrors 15, 25 parallel to one another a distance $d_{\lambda 1}$ apart, which corresponds to a cavity spacing that will pass the desired wavelength $\lambda 1$. By tilting the second mirror 25 with respect to the first mirror 15, as shown in FIG. 3B, the Fabry-Perot cavity 5 is detuned, thereby reflecting substantially all wavelengths of light. The second mirror 25 is then adjusted so that one end 25A is a distance $d_{\lambda 2}$, from the first mirror 15, corresponding to a cavity spacing for the next desired wavelength $\lambda 2$ of light as shown in FIG. 3D, the second mirror 25 is oriented to be parallel to the first mirror at the distance $d_{\lambda 2}$, corresponding to the cavity spacing for the next desired wavelength $\lambda 2$ of light. In this manner, while the distance between the first and second mirrors 15, 25 is varied, the Fabry-Perot cavity 5 is detuned so that it does not pass intermediate varying wavelengths of light during the time period in which the distance between the mirrors is varied.

Figure 7:
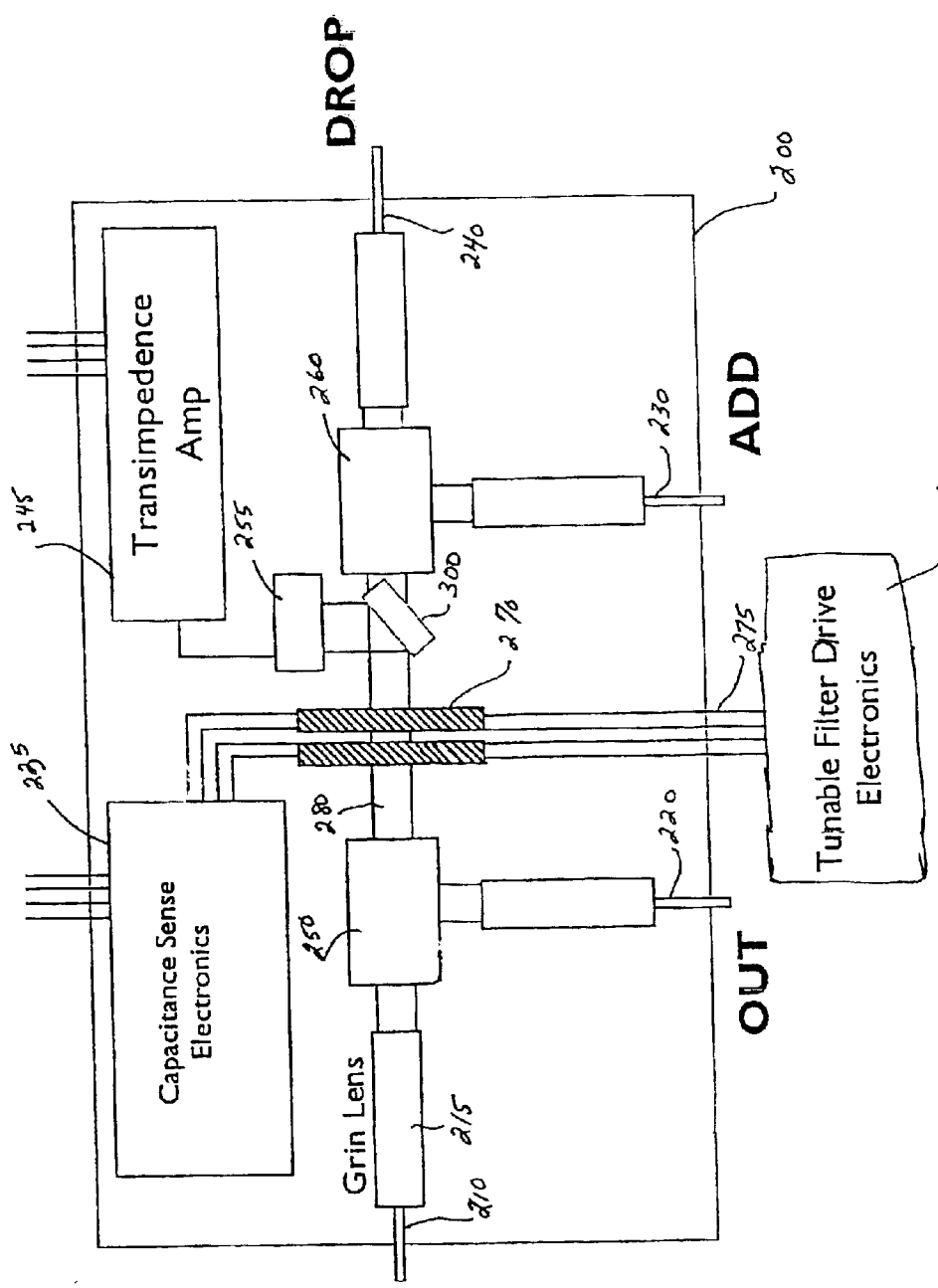
FIG. 7 schematically shows a multiplexer employing the detunable Fabry-Perot interferometer and method according to the invention.

The tunable Fabry-Perot cavity according to the invention has a variety of applications, and is particularly applicable in a multiplexer, for the reasons discussed below. An example of a tunable single channel add/drop multiplexer employing a detunable Fabry-Perot interferometer 1 according to the invention is shown in FIG. 7.

In dense wavelength division multiplexing (DWDM) systems, which transmit numerous wavelengths of light simultaneously over a single optical fiber, Fabry-Perot interferometers used in add/drop multiplexers must exhibit high finesse, because the optical channels are spaced extremely close together in wavelength. Add/drop multiplexers are used to add and/or drop channels as necessary. Thus, it is important that the multiplexer be able to resolve the individual optical channels.

Figure 6:
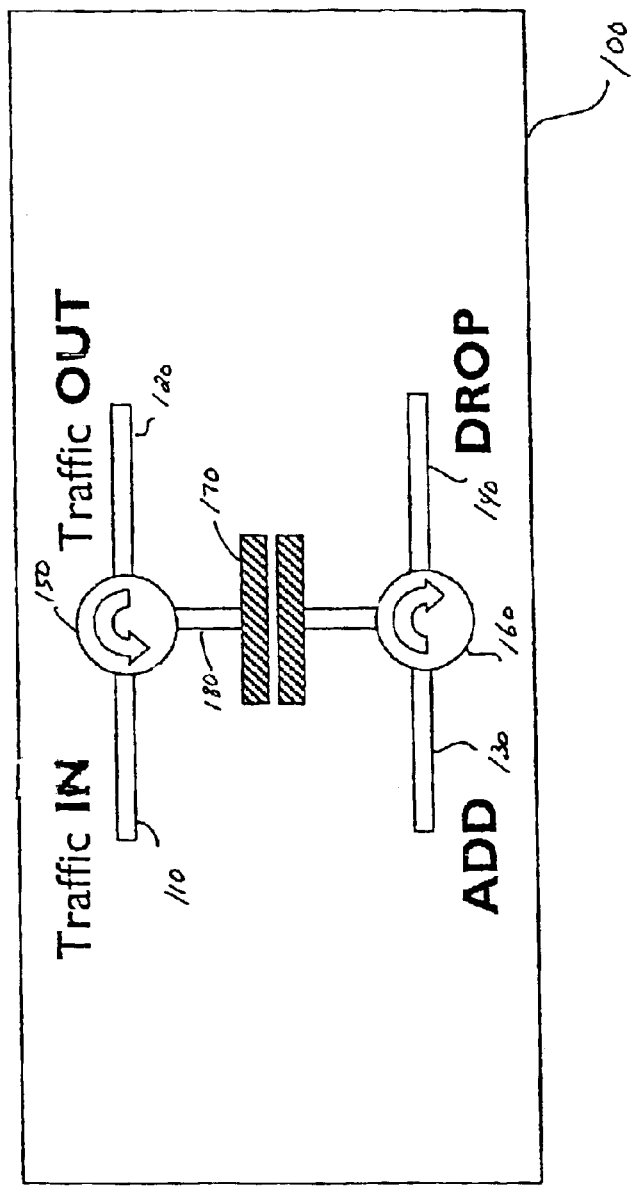
FIG. 6 schematically shows the general layout of a multiplexer employing a Fabry-Perot interferometer.

As shown in FIG. 6, generally, a multiplexer 100 receives an incoming signal, which includes light at different wavelengths, or channels, and is designated as "Traffic IN", via an input path way 110. A circulator re-directs the signal onto pathway 180, which contains a tunable Fabry-Perot interferometer 170. The tunable Fabry-Perot interferometer 170 allows channels to be added to the incoming signal via add pathway 130 and circulator 160, or dropped from the incoming signal via circulator 160 and drop pathway 140. The signal, now designated "Traffic OUT", then exits the multiplexer via output pathway 120.

When no channel is to be added to or dropped from the "Traffic IN" signal, the cavity spacing of the Fabry-Perot interferometer 170 is adjusted so that the resonant wave length of the cavity does not correspond to any of the optical channel wavelengths. Thus, any optical channels impinging on the Fabry-Perot interferometer 170 from circulator 150 are reflected by the Fabry-Perot interferometer 170, as are any optical channels impinging on the Fabry-Perot interferometer 170 from pathway 180, and any optical channels impinging on the Fabry-Perot interferometer 170 from add pathway 130. Accordingly, the "Traffic IN" signal is reflected back to circulator 150, without any additional optical channels being added, and is directed onto the output pathway 120.

When an optical channel is to be added, the cavity spacing of the Fabry-Perot interferometer 170 is adjusted so as to pass the wavelength of the optical channel to be added. Thus, the optical channel to be added is received by circulator 160 from the add pathway 130, and is directed to the Fabry-Perot interferometer 170, where it is passed to circulator 150, and directed to the output pathway 120.

When an optical channel is to be dropped from the "Traffic IN" signal, the cavity spacing of the Fabry-Perot interferometer 170 is adjusted to pass the wavelength of the optical channel to be dropped. Thus, when the optical channel to be dropped impinges on the Fabry-Perot interferometer 170 via pathway 180, it is passed by the Fabry-Perot interferometer 170 and directed to the drop pathway 140 by the circulator 160.

Figure 4:
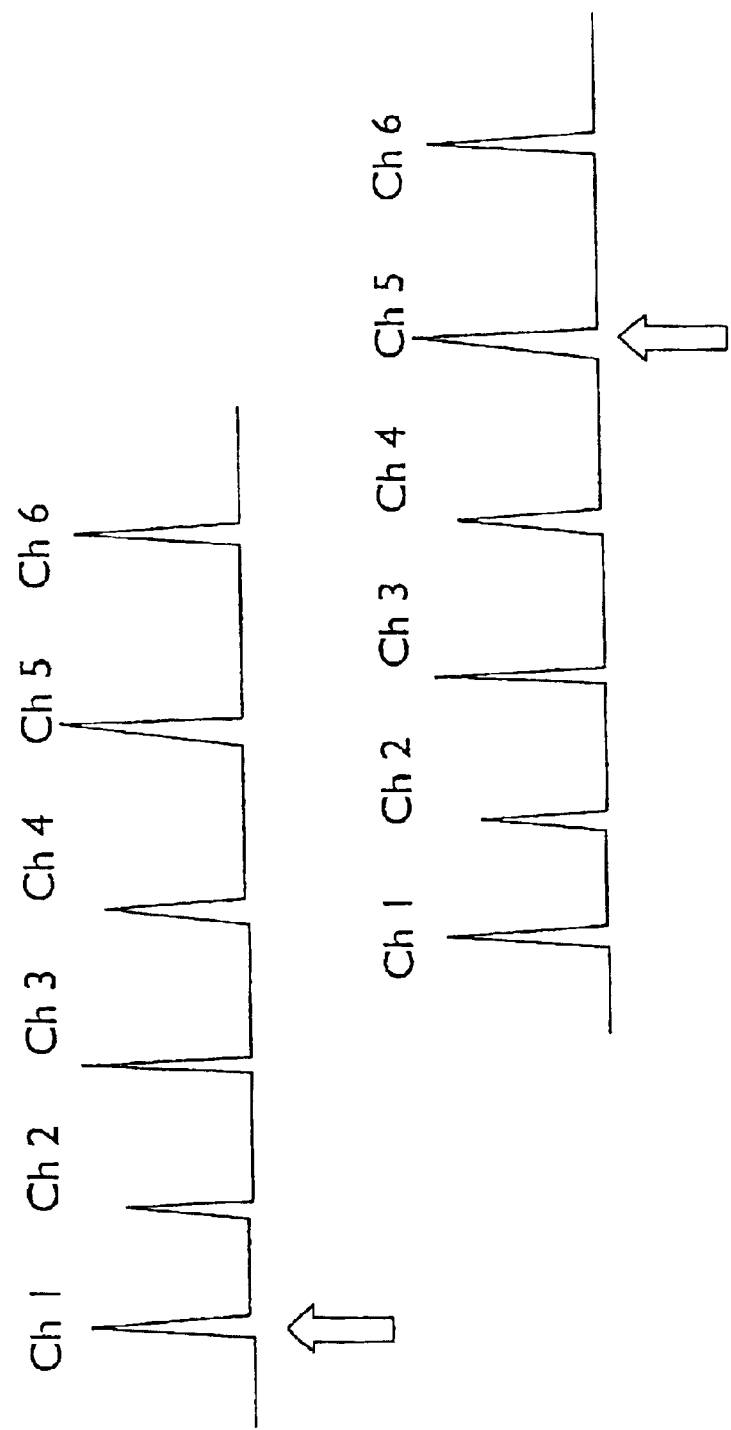
FIG. 4 schematically shows channel changing in a multiplexer.

However, in prior art multiplexers, as the Fabry-Perot interferometer was tuned from, for example, channel 1 to channel 5, as shown in FIG. 4, the Fabry-Perot interferometer scanned through channel 2, then channel 3, then channel 4, before the desired channel (channel 5) was reached. This resulted in optical channels being inadvertently added and/or dropped.

An add/drop multiplexer using the detunable Fabry-Perot interferometer of the invention can be tuned from one optical channel to another without interfering with the optical channels interposed therebetween. FIGS. 5A–5D schematically show the steps of detuning, and then retuning the Fabry-Perot interferometer of the present invention in the context of an add/drop multiplexer. It is noted that, in FIGS. 5A–5D, only the first and second mirrors 15, 25 and the Fabry-Perot cavity 5 are shown for simplicity of explanation.

Figure 5:
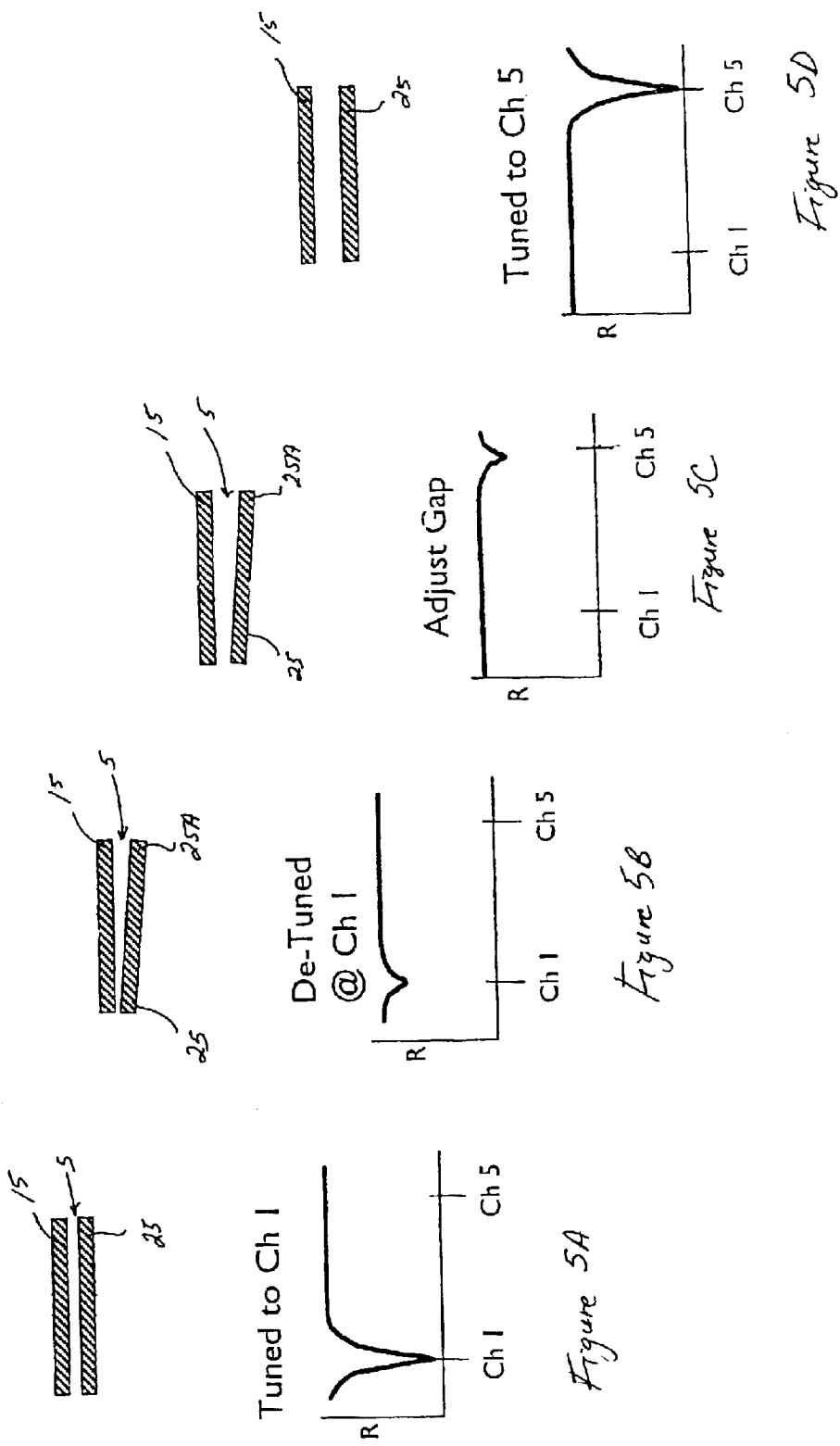
FIGS. 5A–5D schematically show the theoretical application of the Fabry-Perot interferometer and method according to the invention in a multiplexer.

As shown in FIG. 5A, the Fabry-Perot Cavity 5 is initially tuned to the wavelength $\lambda_{ch1}$ of channel 1 by orienting the first and second mirrors 15, 25 parallel to one another a distance $\lambda_{ch1}$ apart, which corresponds to the cavity spacing that will pass the desired wavelength $\lambda_{ch1}$. The second mirror 25 is tilted with respect to the first mirror 15, by an amount sufficient to substantially detune the Fabry-Perot cavity 5, as shown in FIG. 5B. The second mirror 25 is then adjusted so that one end 25A is a distance $d\lambda_{ch5}$ from the first mirror 15, which corresponds to the cavity spacing that will pass the wavelength of channel 5 ($\lambda_{ch5}$) once the mirrors 15, 25 are made substantially parallel. Then, as shown in FIG. 5D, the second mirror 25 is oriented to be substantially parallel to the first mirror at the distance d $\lambda_{ch5}$, which corresponds to the cavity spacing that will pass wavelength $\lambda_{ch5}$. In this manner, while the distance between the first and second mirrors 15, 25 is adjusted, the Fabry-Perot cavity 5 is detuned and does not pass wavelengths corresponding to intervening optical channels 2–4.

FIG. 7 schematically shows a multiplexer employing the detunable Fabry-Perot interferometer and method of the present invention. The multiplexer 200 includes input pathway 210, a GRIN lens 215, a circulator 250, an output pathway 220, a circulator 260, an add pathway 230, and a drop pathway 240. Detunable Fabry-Perot interferometer 270 is provided on pathway 280 connecting circulators 250, 260. The Fabry-Perot interferometer 270 is in electrical communication with both tunable filter drive electronics 276, and capacitance sense electronics 235. A transimpendence amp 245 and photodiode 255 are in communication with pathway 280.

The principle of operation of the multiplexer of FIG. 7 is substantially the same as the multiplexer of FIG. 6, except that the Fabry-Perot interferometer 270, under the control of tunable filter drive electronics 276, is detuned during scanning between optical channels, as described above. The dropped optical channel is monitored by beam splitter 300, photodiode 255, and transimpendence amplifier 245. The beam splitter 300 redirects a small portion of the optical signal coming from the Fabry-Perot interferometer 270, and directs the signal portion to photodiode 255. The photodiode 255 converts the optical signal to an electronic signal, and sends the electronic signal to transimpendence amplifier 245 for amplification.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A Fabry-Perot interferometer, comprising:
    a first mirror;
    a second mirror oriented with respect to the first mirror so as to define a Fabry-Perot cavity therebetween; and
    an actuator configured to adjust a resonant wavelength of the Fabry-Perot cavity by varying a gap between the first and second mirrors, wherein the actuator is configured to selectively maintain the first and second mirrors in a substantially non-parallel relationship while the resonant wavelength of the Fabry-Perot interferometer is varied.

2. The Fabry-Perot interferometer according to claim 1, wherein, when the actuator maintains the first and second mirror in a substantially parallel relationship with respect to one another, the Fabry-Perot interferometer passes a predetermined wavelength of light therethrough, and when the actuator maintains the first and second mirrors in a substantially non-parallel relationship with respect to one another, the Fabry-Perot interferometer reflects substantially wavelengths of light.

3. The Fabry-Perot interferometer according to claim 1, wherein the first mirror is fixed, and the second mirror is movable by the actuator to adjust the gap between the first and second mirrors.

4. The Fabry-Perot interferometer according to claim 1, wherein the first and second mirrors are partially reflective.

5. The Fabry-Perot interferometer according to claim 1, wherein the first mirror is affixed to a mirror support.

6. The Fabry-Perot interferometer according to claim 5, wherein the mirror support comprises silicon.

7. The Fabry-Perot interferometer according to claim 5, wherein the mirror support has an anti-reflective coating on a surface opposite to a surface to which the first mirror is affixed.

8. The Fabry-Perot interferometer according to claim 1, wherein the second mirror is affixed to a compliant optical support, and portion of the compliant optical support is substantially flexible.

9. The Fabry-Perot interferometer according to claim 1, wherein the second mirror is affixed to a compliant optical support, wherein at least a portion of the compliant optical support comprises silicon, and another portion of the compliant optical support comprises a compliant material.

10. The Fabry-Perot interferometer according to claim 9, wherein the compliant material comprises a elastomer.

11. The Fabry-Perot interferometer according to claim 10, wherein the compliant optical support comprises:
    an island, to which the second mirror is affixed; and
    a frame, wherein the island and the frame are flexibly joined by a compliant member.

12. The Fabry-Perot interferometer according to claim 11, wherein at least a portion of the actuator is attached to the island.

13. The Fabry-Perot interferometer according to claim 11, wherein the compliant member comprises an elastomer.

14. The Fabry-Perot interferometer according to claim 11, wherein the island and the frame comprise silicon.

15. The Fabry-Perot interferometer according to claim 11, wherein the actuator comprises:
    a plurality of electrodes positioned on a surface of the island opposite a surface to which the second mirror is attached; and
    an electrode disposed on an actuator support.

16. The Fabry-Perot interferometer according to claim 15, wherein the actuator support comprises silicon.

17. The Fabry-Perot interferometer according to claim 15, further comprising an anti-reflective coating formed on the surface of the island where the plurality of electrodes are formed.

18. The Fabry-Perot interferometer according to claim 1, wherein the second mirror is affixed to a complaint optical support that is movable by the actuator.

19. A wavelength-division-multiplexer system comprising the Fabry-Perot interferometer of claim 1.

20. A Fabry-Perot interferometer, comprising:
    a first mirror;
    a second mirror oriented with respect to the first mirror so as to define a Fabry-Perot cavity therebetween; and
    an actuator configured to tune a resonant wavelength of the Fabry-Perot cavity between a first wavelength and a second wavelength by varying a gap between the first and second mirrors, wherein the actuator controls the relationship between the first and second mirrors to suppress transmission of intervening resonant wavelengths while the resonant wavelength of the Fabry-Perot cavity is tuned from the first wavelength to the second wavelength.

21. The Fabry-Perot interferometer of claim 20, wherein the actuator controls a tilt of the first or second mirror to suppress the transmission of intervening wavelengths.

22. A multiplexer for a telecommunications system, comprising:
    an input pathway though which a main optical signal is input into the multiplexer;
    an output pathway though which a main optical signal is output from the multiplexer;
    an add pathway though which an optical channel is added to the main optical signal;
    a drop pathway though which an optical channel is removed from the main optical signal;
    an auxiliary pathway containing a tunable Fabry-Perot interferometer;
    a first circulator joining the auxiliary pathway to the input pathway and the output pathway; and
    a second circulator joining the auxiliary pathway to the add pathway and the drop pathway, wherein the Fabry-Perot interferometer comprises:
        a first mirror;
        a second mirror oriented with respect to the first mirror so as to define a Fabry-Perot cavity therebetween; and
        an actuator configured to adjust a resonant wavelength of the Fabry-Perot cavity by varying a gap between the first and second mirrors, wherein the actuator is configured to selectively maintain the first and second mirror in a substantially non-parallel relationship while the resonant wavelength of the Fabry-Perot interferometer is varied.

23. A method of tuning a Fabry-Perot interferometer between a first resonant wavelength and a second resonant wavelengths, comprising:
    suppressing transmission of resonant wavelengths that lie between the first and second resonant wavelengths while adjusting a gap between the first and second Fabry-Perot cavity mirrors to tune between the first and second resonant wavelengths.

24. The method of tuning a Fabry-Perot interferometer according to claim 23, wherein the resonant wavelengths that lie between the first and second wavelengths are suppressed by tilting the first or second Fabry-Perot mirror with respect to the other.

25. The method of tuning a Fabry-Perot interferometer according to claim 24, wherein the first and second mirror are oriented so as to be substantially parallel to one another after the Fabry-Perot interferometer is tuned from the first resonant wavelength to the second resonant wavelength.

26. The method of tuning a Fabry-Perot interferometer according to claim 23, wherein the step of adjusting the gap between the first and second Fabry-Perot cavity mirrors comprises maintaining the first Fabry-Perot cavity mirror in a fixed position and moving the second Fabry-Perot cavity mirror.

* * * * *